(12) United States Patent
Koivuluoma et al.

(10) Patent No.: US 9,335,105 B2
(45) Date of Patent: May 10, 2016

(54) COOLING ASSEMBLY

(71) Applicant: ABB Research Ltd, Zurich (CH)

(72) Inventors: Timo Koivuluoma, Vantaa (FI); Bruno Agostini, Zurich (CH); Mathieu Habert, Rheinfelden (CH); Jouko Siirilä, Yli-Ullava (FI)

(73) Assignee: ABB RESEARCH LTD, Zürich (CH)

( * ) Notice: Subject to any disclaimer, the term of this patent is extended or adjusted under 35 U.S.C. 154(b) by 413 days.

(21) Appl. No.: 13/871,410

(22) Filed: Apr. 26, 2013

(65) Prior Publication Data
US 2013/0292088 A1 Nov. 7, 2013

(30) Foreign Application Priority Data

May 2, 2012 (EP) ..................................... 12166363

(51) Int. Cl.
*F24B 13/00* (2006.01)
*F28G 1/16* (2006.01)
*H05K 7/20* (2006.01)

(52) U.S. Cl.
CPC ................ *F28G 1/166* (2013.01); *H05K 7/202* (2013.01); *H05K 7/20181* (2013.01)

(58) Field of Classification Search
CPC ....................................................... B01D 46/46
USPC ............................ 165/303; 55/282.2, 283, 307
See application file for complete search history.

(56) References Cited

U.S. PATENT DOCUMENTS

| | | | | |
|---|---|---|---|---|
| 3,670,808 A | * | 6/1972 | Wait, Jr. ............. | B60H 1/00378 165/42 |
| 3,688,484 A | * | 9/1972 | Cox ......................... | A01D 7/10 294/50.8 |
| 3,934,302 A | * | 1/1976 | Mabuchi ................... | A47L 5/24 15/339 |

(Continued)

FOREIGN PATENT DOCUMENTS

| CN | 200994229 Y | 12/2007 |
|---|---|---|
| CN | 102124295 A | 7/2011 |

(Continued)

OTHER PUBLICATIONS

European Search Report issued on Oct. 29, 2012.

(Continued)

*Primary Examiner* — Ljiljana Ciric
(74) *Attorney, Agent, or Firm* — Buchanan Ingersoll & Rooney PC

(57) ABSTRACT

A cooling assembly is disclosed having a device chamber, a cooling chamber, a heat exchanger, a fan and a controller, the heat exchanger having a first heat exchanger unit and a second heat exchanger unit located above the first heat exchanger unit. The fan includes a first fan adapted to generate a first cooling air flow. The cooling assembly further includes a first dust tray located between the first heat exchanger unit and the second heat exchanger unit, the first cooling air flow being directed towards the first dust tray. The first dust tray is adapted to receive and retain at least part of contaminant particles present in the first cooling air flow, the device chamber being separated from the cooling chamber.

14 Claims, 3 Drawing Sheets

(56) References Cited

U.S. PATENT DOCUMENTS

| | | | | |
|---|---|---|---|---|
| 4,044,245 A * | 8/1977 | Mabuchi | A47L 5/24 | 362/92 |
| 4,068,648 A * | 1/1978 | Erdman | B28D 1/047 | 125/13.01 |
| 4,227,902 A * | 10/1980 | Olson | B01D 46/0068 | 451/456 |
| 4,433,511 A * | 2/1984 | Swain | B24C 3/067 | 451/87 |
| 4,452,301 A * | 6/1984 | Last | B60H 1/00678 | 165/103 |
| 4,587,890 A * | 5/1986 | Hurlburt | B60H 3/0616 | 454/136 |
| 4,606,260 A * | 8/1986 | Cox | A61F 9/06 | 454/56 |
| 4,647,295 A * | 3/1987 | Christ | A45D 29/00 | 132/73 |
| 4,674,626 A * | 6/1987 | Adcock | B65G 15/60 | 198/720 |
| 4,813,385 A * | 3/1989 | Yamaguchi | B01D 46/0024 | 123/2 |
| 4,813,397 A * | 3/1989 | Yamada | A47J 37/06 | 126/21 A |
| 4,819,790 A * | 4/1989 | Adcock | B65G 15/60 | 198/720 |
| 4,953,347 A * | 9/1990 | Siegfried | A01B 1/00 | 294/50.8 |
| 4,964,921 A * | 10/1990 | Lloyd | F23J 3/026 | 134/21 |
| 5,083,731 A * | 1/1992 | Fullilove | B62B 1/147 | 141/231 |
| 5,279,016 A * | 1/1994 | Klassen | A47L 5/38 | 15/301 |
| 5,309,597 A * | 5/1994 | Wymore | A46B 5/06 | 15/179 |
| 5,319,821 A * | 6/1994 | Nicholson | A46B 15/00 | 15/104.8 |
| 5,391,218 A * | 2/1995 | Jorgenson | B01D 46/0068 | 55/283 |
| 5,410,775 A * | 5/1995 | Frazier | A47L 5/24 | 15/327.5 |
| 5,425,153 A * | 6/1995 | Vosbikian | A47L 13/52 | 15/257.2 |
| 5,504,967 A * | 4/1996 | Graham | A47L 5/38 | 15/301 |
| 5,560,077 A * | 10/1996 | Crotchett | A47L 13/52 | 15/339 |
| 5,638,572 A * | 6/1997 | Canni Ferrari | A47L 5/24 | 15/323 |
| 5,647,906 A * | 7/1997 | Monday | B08B 1/02 | 118/307 |
| 5,722,112 A * | 3/1998 | Scanni | A47L 5/24 | 15/344 |
| 5,795,219 A * | 8/1998 | Bloom | A45D 29/00 | 211/131.1 |
| 5,839,158 A * | 11/1998 | Schupp | A47L 5/24 | 15/144.4 |
| 5,868,858 A * | 2/1999 | Creed | B08B 9/0436 | 134/21 |
| 5,931,988 A * | 8/1999 | LeBlanc | B01D 46/001 | 55/341.1 |
| 5,974,749 A * | 11/1999 | Herbert | E04F 17/12 | 52/302.1 |
| 6,029,311 A * | 2/2000 | Scanni | A47L 5/24 | 15/344 |
| 6,234,549 B1 * | 5/2001 | Brownell | A01K 1/0114 | 294/1.3 |
| 6,643,130 B1 | 11/2003 | DeMarchis et al. | | |
| 2001/0029853 A1 * | 10/2001 | Weishew | B41F 5/24 | 101/216 |
| 2003/0077385 A1 * | 4/2003 | Ainsworth | B05B 15/1211 | 427/180 |
| 2004/0055705 A1 * | 3/2004 | Shutic | B05B 15/1211 | 156/307.1 |
| 2004/0058141 A1 * | 3/2004 | Shutic | B05B 15/1211 | 428/314.8 |
| 2005/0015919 A1 * | 1/2005 | Stewart | A47L 5/28 | 15/344 |
| 2005/0055794 A1 * | 3/2005 | Marshall | A47L 5/225 | 15/353 |
| 2007/0000815 A1 * | 1/2007 | Nurudeen | A46B 7/023 | 209/215 |
| 2007/0295288 A1 * | 12/2007 | Wulff | C10H 3/00 | 123/3 |
| 2008/0115307 A1 * | 5/2008 | Phelan | A47L 7/0009 | 15/246.4 |
| 2008/0235897 A1 * | 10/2008 | Kim | A47L 7/02 | 15/319 |
| 2008/0276395 A1 * | 11/2008 | Powell | A01K 13/001 | 15/143.1 |
| 2009/0094776 A1 * | 4/2009 | Lowrance, III | A47L 7/0047 | 15/301 |
| 2009/0106998 A1 * | 4/2009 | Brown-Carter | A45D 20/12 | 34/90 |
| 2009/0172912 A1 * | 7/2009 | Knopow | A46B 15/0002 | 15/344 |
| 2009/0288528 A1 * | 11/2009 | Fullerton | B25G 3/00 | 81/489 |
| 2010/0013252 A1 * | 1/2010 | Hopp | A01B 1/20 | 294/50.8 |
| 2010/0132151 A1 * | 6/2010 | Khalil | A46B 9/028 | 15/344 |
| 2010/0154838 A1 | 6/2010 | Shih et al. | | |
| 2011/0099765 A1 * | 5/2011 | Youssefieh | A01D 7/00 | 16/430 |
| 2012/0000001 A1 * | 1/2012 | Powell | A41D 13/082 | 2/20 |
| 2012/0081555 A1 * | 4/2012 | Deering | G03B 15/08 | 348/207.1 |
| 2013/0281596 A1 * | 10/2013 | Mohan | C08L 23/142 | 524/427 |
| 2014/0215749 A1 * | 8/2014 | Van Der Kooi | A47L 9/0488 | 15/322 |
| 2015/0289735 A1 * | 10/2015 | Van Der Kooi | A47L 9/02 | 15/383 |

FOREIGN PATENT DOCUMENTS

| | | |
|---|---|---|
| EP | 2 336 699 A1 | 6/2011 |
| TW | 201026192 A | 7/2010 |
| WO | WO 2008/071048 A1 | 6/2008 |

OTHER PUBLICATIONS

Office Action issued on Nov. 14, 2014, by the State Intellectual Property Office of People's Republic of China in corresponding Chinese Patent Application No. 201310158438.8, and an English Translation of the Office Action. (12 pages).

* cited by examiner

COOLING ASSEMBLY

RELATED APPLICATION(S)

This application claims priority under 35 U.S.C. §119 to European Patent Application No. 12166363.7 filed in Europe on May 2, 2012, the entire contents of which are hereby incorporated by reference in its entirety.

FIELD

The present disclosure relates to a cooling assembly.

BACKGROUND INFORMATION

Clogging of heat exchanger in known cooling assemblies can occur due to contaminant particles present in cooling air flow.

SUMMARY

A cooling assembly is disclosed, comprising: a device chamber; a cooling chamber; heat exchanger, system wherein the heat exchanger system includes a first heat exchanger unit and a second heat exchanger unit located above the first heat exchanger unit, each of the first and second heat exchanger units including a first end located in the device chamber, and a second end located in the cooling chamber, the heat exchanger system being adapted to transfer heat from the device chamber to the cooling chamber; fan system, the fan system including a first fan adapted to generate a first cooling air flow from ambient air to the cooling chamber between the first heat exchanger unit and the second heat exchanger unit; control system, the control system being adapted to control the fan system; and a first dust tray located between the first heat exchanger unit and the second heat exchanger unit, such that the first cooling air flow will be directed towards the first dust tray, the first dust tray being adapted to receive and retain at least part of contaminant particles present in the first cooling air flow, and wherein the device chamber is separated from the cooling chamber.

BRIEF DESCRIPTION OF THE DRAWINGS

In the following, exemplary embodiments will be described in greater detail by reference to the attached drawings, in which.

DETAILED DESCRIPTION

The present disclosure provides a cooling assembly, which can help alleviate clogging of a heat exchanger due to contaminant particles present in cooling air flow.

The disclosure provides a cooling assembly with a first dust tray located in the vertical direction between a first heat exchanger unit and a second heat exchanger unit, the first dust tray being adapted to receive and retain at least part of contaminant particles present in a first cooling air flow generated by a first fan and directed towards the first dust tray.

The cooling assembly of the disclosure can help reduce the risk of clogging of heat exchanger units.

Figure 1:
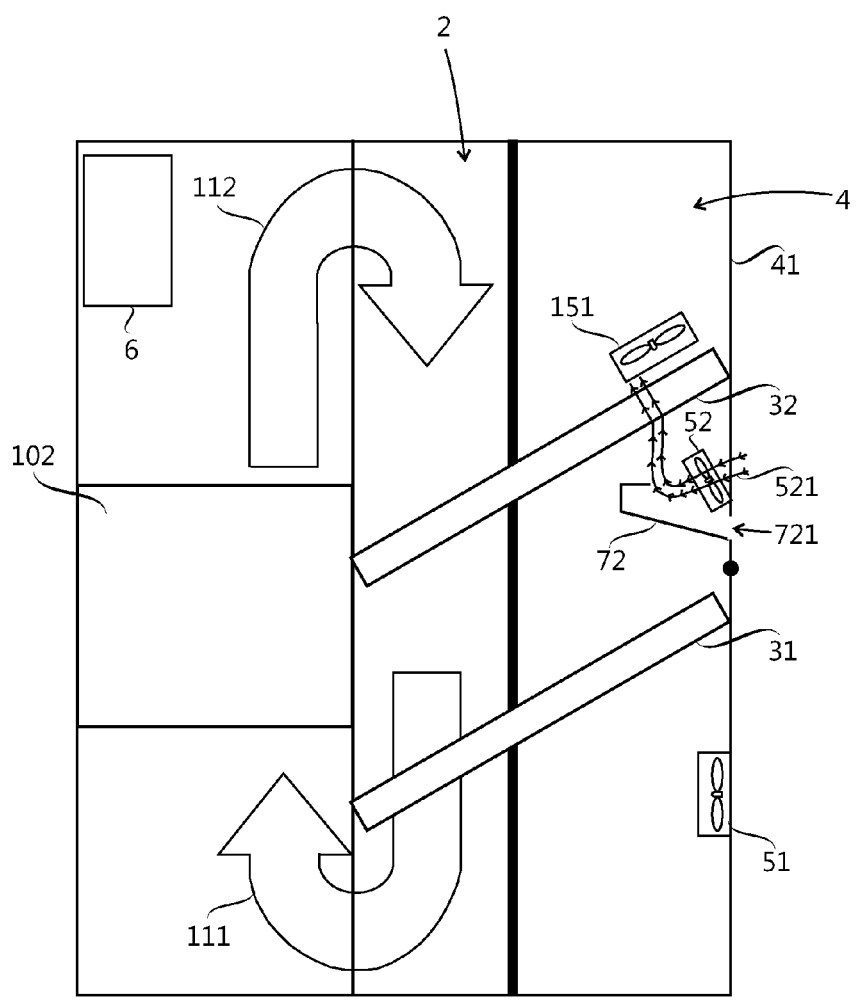
FIG. 1 is shows an exemplary cooling assembly according to an embodiment of the disclosure.

FIG. 1 is shows an exemplary cooling assembly having a device chamber 2, a cooling chamber 4, a heat exchanger serving as an exemplary heat exchanger system, a fan serving as a fan system for cooling, a first dust tray 72 and control system 6 (e.g., specifically programmed processor) for controlling the fan system. FIG. 1 shows the cooling assembly during cooling operation. The heat exchanger system can be adapted to transfer heat from the device chamber 2 to the cooling chamber 4. The heat exchanger system can include a first heat exchanger unit 31 and a second heat exchanger unit 32 located above the first heat exchanger unit 31. The first heat exchanger unit 31 and the second heat exchanger unit 32 can be spaced apart in the vertical direction.

Each of the first 31 and second 32 heat exchanger units can include a first end located in the device chamber 2, and a second end located in the cooling chamber 4. Each of the heat exchanger units can be tilted such that the first end is substantially lower than the second end. The device chamber 2 can be separated from the cooling chamber 4 such that there is substantially no air flow between the device chamber 2 and the cooling chamber 4. Therefore substantially no contaminant particles (e.g., no detectable particles and/or particles of less than threshold size) can pass from the cooling chamber 4 into the device chamber 2.

In accordance with an exemplary embodiment, a heat generating apparatus 102 can be in the device chamber 2. The heat generating apparatus 102 can be an apparatus that involves cooling. The heat generating apparatus 102 can include, for example, a frequency converter or inverter. An arrow 112 illustrates a hot air flow from the heat generating apparatus 102 towards the first ends of the first heat exchanger unit 31 and second heat exchanger unit 32. An arrow 111 illustrates a cooled air flow from the first ends of the first heat exchanger unit 31 and second heat exchanger unit 32 towards the heat generating apparatus 102.

The fan system can include a first fan 52 adapted to generate a first cooling air flow 521 from ambient air to the cooling chamber 4 between the first heat exchanger unit 31 and the second heat exchanger unit 32. The first fan 52 can be adapted to transfer heat from the cooling chamber 4 to ambient air during the cooling operation. In accordance with an exemplary embodiment, heat can be transferred from the cooling chamber 4 to ambient air due to an overpressure above the second heat exchanger unit 32. An air flow from the cooling chamber 4 to ambient air is not depicted in FIG. 1, and nor is a discharge opening through which the air flow passes.

In an exemplary embodiment there can be a filter in front of the first fan. The filter can be located such that a first cooling air flow passes through the filter before passing through the first fan. The filter can include a coarse filter.

The first dust tray 72 can be located between the first heat exchanger unit 31 and the second heat exchanger unit 32. The first cooling air flow 521 can be directed towards the first dust tray 72, and the first dust tray 72 can be adapted to receive and retain at least part of contaminant particles present in the first cooling air flow 521.

The first dust tray 72 can be formed as an air guide adapted to guide the first cooling air flow 521 towards the second heat exchanger unit 32 substantially in vertical direction. In accordance with an exemplary embodiment, consequently the first cooling air flow 521 confronts a lower surface of the second heat exchanger unit 32 in a point located above the first dust tray 72. Therefore any contaminant particles falling off the first cooling air flow 521 before the second heat exchanger unit 32 can be likely to land in the first dust tray 72, and not on the first heat exchanger unit 31. Consequently the first heat exchanger unit 31 can remain clean and maintain its cooling capacity.

The first fan 52 can be tilted downwards in order to direct the first cooling air flow 521 sloping downwards towards the first dust tray 72. An angle of the first fan 52 relative to the vertical direction can be approximately 45°. In an exemplary embodiment the first fan 52 is not tilted but the first cooling air flow 521 is deflected downwards by a suitable deflector.

The first dust tray 72 can be located in a front portion of the cooling chamber 4, the front portion being removed from the device chamber 2 and adjacent to an exterior wall 41 of the cooling chamber 4. A bottom wall of the first dust tray 72 can be inclined towards the exterior wall of the cooling chamber 4. The inclination can both guide the first cooling air flow 521 and facilitate slipping of contaminant particles into a front portion of the first dust tray 72. An outermost end of the first dust tray 72 can be bent back towards the exterior wall 41 of the cooling chamber 4 in order to help prevent the first cooling air flow 521 from blowing contaminant particles out of the first dust tray 72. In accordance with an exemplary embodiment, a discharge opening 721 can be in the exterior wall 41 of the cooling chamber 4, the discharge opening 721 communicating with the first dust tray 72 and being adapted to allow at least part of contaminant particles retained in the first dust tray 72 to fall out of the cooling chamber 4.

A width of the first dust tray 72 can be substantially equal to a width of the cooling chamber 4. Further, a width of each of the first heat exchanger unit 31 and the second heat exchanger unit 32 can be substantially equal to a width of the cooling chamber 4. Herein, a width direction can be a direction perpendicular to the image plane of FIG. 1.

Figure 2:
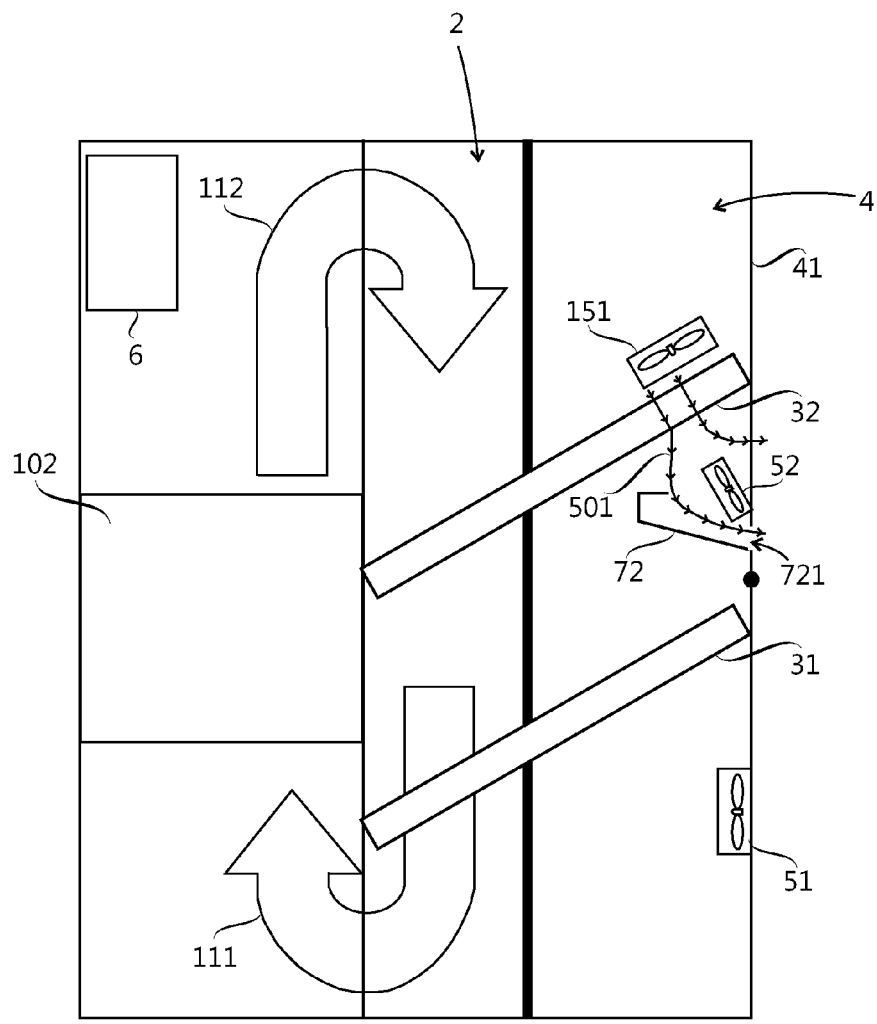
FIG. 2 shows the exemplary cooling assembly of FIG. 1 during an automatic cleaning operation.

The control system 6 can be adapted to provide an automatic cleaning operation which is shown in FIG. 2. During the automatic cleaning operation, a first cleaning air flow 501 can be generated from the cooling chamber 4 to the ambient air, the first cleaning air flow 501 being substantially opposite to the first cooling air flow 521.

The fan system can include a bottom fan 51 and a first cleaning fan 151. The bottom fan 51 can be adapted to run during the cooling operation. The bottom fan 51 can be located in a bottom part of the cooling chamber 4, below the first heat exchanger unit 31. The bottom fan 51 can be adapted to generate an air flow from the ambient air to the bottom part of the cooling chamber 4. A part of the air flow generated by the bottom fan 51 can reach the second heat exchanger unit 32 after passing through the first heat exchanger unit 31 and through a space between the first dust tray 72 and the device chamber 2. An air flow from the bottom part to an upper part of the cooling chamber 4 can pass through the first heat exchanger unit 31 and the second heat exchanger unit 32.

In the exemplary embodiment shown in FIG. 1 there is no dust tray below the bottom fan 51 since there is no heat exchanger unit below the bottom fan 51. Contaminant particles falling off the air flow of the bottom fan 51 land on a bottom wall of the cooling chamber 4 without hindering operation of the heat exchanger system. In an exemplary embodiment there is a dust tray below a bottom fan located below a lowest heat exchanger unit, the dust tray being adapted to receive and retain at least part of contaminant particles present in the air flow generated by the bottom fan, thereby preventing the contaminant particles from proceeding to the lowest heat exchanger unit.

The first cleaning fan 151 can be located above the second heat exchanger unit 32 and adapted to generate a first cleaning fan air flow directed towards an upper surface of the second end of the second heat exchanger unit 32. In the exemplary embodiment of FIG. 2 the first cleaning fan air flow can form the entire first cleaning air flow 501 while the first fan 52 and the bottom fan 51 are turned off. In an exemplary embodiment the first cleaning air flow can be provided at least partially with the first fan by reversing the rotational direction of the first fan. It should be noted that some contaminant particles can fall off the second heat exchanger unit 32 simply due to turning off the first fan 52.

The first cleaning air flow 501 can release contaminant particles from the second heat exchanger unit 32, and particularly from a bottom surface of the second heat exchanger unit 32. The first cleaning air flow 501 can carry the contaminant particles from the second heat exchanger unit 32 into the first dust tray 72 or directly into the ambient air through air intake of the first fan 52, the air intake being a structure through which the first fan 52 sucks cooling air from the ambient air during the cooling operation. The first cleaning air flow 501 can facilitate expulsion of contaminant particles from the first dust tray 72 out of the cooling chamber through the discharge opening 721.

The cooling assembly can include a first pivotable portion 202 adapted to pivot with relation to the cooling chamber 4 between a use position and a cleaning position. The first dust tray 72 and the first fan 52 can be mounted on the first pivotable portion 202. In FIGS. 1 and 2 the first pivotable portion 202 can be in the use position and in FIG. 3 the first pivotable portion 202 can be in the cleaning position. The cleaning position of the first pivotable portion 202 can be adapted for dumping contaminant particles retained in the first dust tray 72 out of the cooling chamber 4. Removal of contaminant particles can be facilitated for example by brushing or vacuum-cleaning. The cleaning position of the first pivotable portion 202 can be used for cleaning the first fan 52, and/or cleaning an upper surface of the first heat exchanger unit 31 and a lower surface of the second heat exchanger unit 32.

Figure 3:
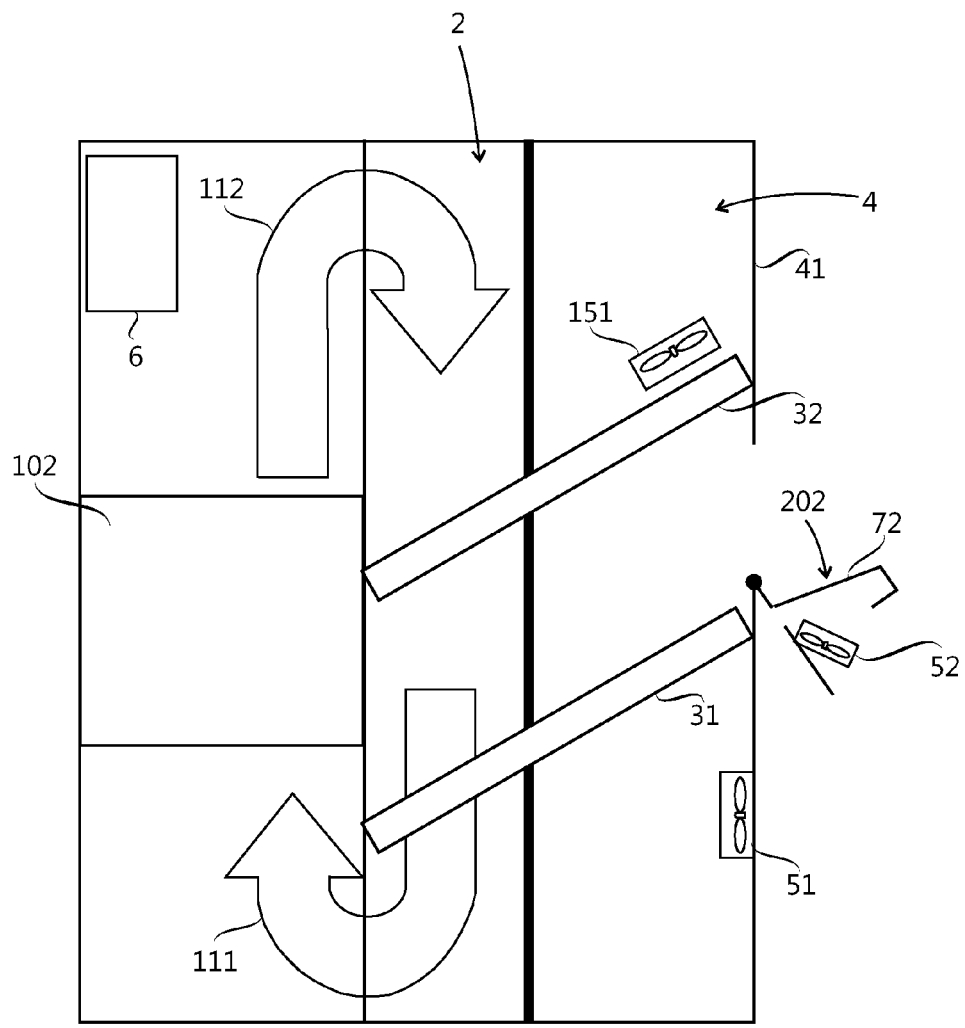
FIG. 3 shows the exemplary cooling assembly of FIG. 1 with a first pivotable portion in a cleaning position.

FIG. 3 shows that in the cleaning position of the first pivotable portion 202 the first dust tray 72 can be substantially upside down such that a normal vector of the inner bottom wall of the first dust tray 72 is in an acute angle of approximately 20° relative to the vertical direction. Therefore in the cleaning position a certain amount of contaminant particles normally fall out of the first dust tray 72 due to mere gravity.

Herein contaminant particles can be any particles or objects that could impede operation of the heat exchanger system. The contaminant particles can include sand, dust, dirt, or pieces of plants such as leafs. The contaminant particles can include litter such as candy wrappings.

The exemplary cooling assembly shown in FIGS. 1 to 3 has two heat exchanger units. An exemplary embodiment can include three or more heat exchanger units spaced apart in vertical direction. For each pair of adjacent heat exchanger units there can be a dust tray between the adjacent heat exchanger units. Further, there can be a fan for each pair of adjacent heat exchanger units adapted to generate a cooling air flow from ambient air to the cooling chamber between the adjacent heat exchanger units, the cooling air flow being directed towards the dust tray, the dust tray being adapted to receive and retain at least part of contaminant particles present in the cooling air flow.

In an exemplary embodiment shown in the Figures the heat exchanger units can be compact thermosyphon heat exchangers. In accordance with exemplary embodiments, different types of heat exchangers can be used.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A cooling assembly comprising:
   a device chamber;
   a cooling chamber;
   heat exchanger system, wherein the heat exchanger system includes a first heat exchanger unit and a second heat exchanger unit located above the first heat exchanger unit, each of the first and second heat exchanger units including a first end located in the device chamber, and a second end located in the cooling chamber, the heat exchanger system being adapted to transfer heat from the device chamber to the cooling chamber;
   fan system, the fan system including a first fan adapted to generate a first cooling air flow from ambient air to the cooling chamber between the first heat exchanger unit and the second heat exchanger unit;
   control system, the control means being adapted to control the fan system; and
   a first dust tray located between the first heat exchanger unit and the second heat exchanger unit, such that the first cooling air flow will be directed towards the first dust tray, the first dust tray being adapted to receive and retain at least part of contaminant particles present in the first cooling air flow, and wherein the device chamber is separated from the cooling chamber.

2. The cooling assembly according to claim 1, wherein the first dust tray is formed as an air guide adapted to guide the first cooling air flow towards the second heat exchanger unit.

3. The cooling assembly according to claim 2, wherein the first dust tray is adapted to guide the first cooling air flow towards the second heat exchanger unit substantially in a vertical direction.

4. The cooling assembly according to claim 1, wherein the fan system is adapted to direct the first cooling air flow sloping downwards towards the first dust tray.

5. The cooling assembly according to claim 1, wherein the first dust tray is located in a front portion of the cooling chamber, the front portion being removed from the device chamber and adjacent to an exterior wall of the cooling chamber.

6. The cooling assembly according to claim 5, comprising:
   a bottom wall of the first dust tray, which is inclined towards the exterior wall of the cooling chamber.

7. The cooling assembly according to claim 6, comprising:
   a discharge opening in the exterior wall of the cooling chamber, the discharge opening communicating with the first dust tray and being adapted to allow at least part of contaminant particles retained in the first dust tray to fall out of the cooling chamber.

8. The cooling assembly according to claim 1, comprising:
   a first pivotable portion adapted to pivot with relation to the cooling chamber between a use position and a cleaning position, the first dust tray being mounted on the first pivotable portion.

9. The cooling assembly according to claim 8, wherein the first fan is mounted on the first pivotable portion.

10. The cooling assembly according to claim 1, wherein a width of the first dust tray is substantially equal to a width of the cooling chamber.

11. The cooling assembly according to claim 1, wherein the control system are adapted to provide an automatic cleaning operation during which a first cleaning air flow is generated from the cooling chamber to the ambient air, the first cleaning air flow being substantially opposite to the first cooling air flow.

12. The cooling assembly according to claim 11, comprising:
   a first cleaning fan located above the second heat exchanger unit and adapted to generate a first cleaning fan air flow directed towards an upper surface of the second end of the second heat exchanger unit, wherein the first cleaning fan air flow forms at least part of the first cleaning air flow.

13. The cooling assembly according to claim 12, wherein the first cleaning air flow is provided at least partially with the first fan by reversing a rotational direction of the first fan.

14. The cooling assembly according to claim 11, wherein the first cleaning air flow is provided at least partially with the first fan by reversing a rotational direction of the first fan.

* * * * *